United States Patent [19]

Matsudo et al.

[11] Patent Number: 5,101,110
[45] Date of Patent: Mar. 31, 1992

[54] ION GENERATOR

[75] Inventors: Masahiko Matsudo; Akira Koshiishi; Naoki Takayama, all of Kofu; Kohei Kawamura, Nirasaki, all of Japan

[73] Assignee: Tokyo Electron Limited, Tokyo, Japan

[21] Appl. No.: 611,046

[22] Filed: Nov. 9, 1990

[30] Foreign Application Priority Data

Nov. 14, 1989 [JP] Japan .................................. 1-295421

[51] Int. Cl.$^5$ .............................................. H01J 3/04
[52] U.S. Cl. .............................. 250/427; 315/111.81; 313/230; 313/362.1
[58] Field of Search .................... 250/427, 423 R, 288; 315/111.81; 313/230, 362.1

[56] References Cited

U.S. PATENT DOCUMENTS

| | | | |
|---|---|---|---|
| 2,258,149 | 10/1941 | Schutze | 250/427 |
| 3,601,649 | 8/1971 | Steigerwald | 250/493.1 |
| 4,166,952 | 9/1979 | Colby et al. | 250/427 |
| 4,383,177 | 5/1983 | Keller et al. | 250/427 |

*Primary Examiner*—Jack I. Berman
*Assistant Examiner*—Kiet T. Nguyen
*Attorney, Agent, or Firm*—Oblon, Spivak, McClelland, Maier & Neustadt

[57] ABSTRACT

An ion generator comprises an electron-generating chamber and an ion-generating chamber. Ions are generated by introducing a raw material gas into the ion-generating chamber and irradiating the raw material gas with electrodes generated in the electron-generating chamber. The ions, thus generated, are drawn by ion-collecting electrodes and guided out of the ion-generating chamber through a slit formed in the ion output section of the ion-generating chamber. That corner of the ion-generating chamber which faces the ion-collecting electrodes is curved, and that outer wall of the ion-generating chamber which faces the ion-collecting electrodes is specular. With this structure, an undesirable spark discharge does not easily take place with reference to the ion-collecting electrodes, so that damage to the structural components of the ion generator is suppressed. Further, the ion output section is removable from the main body of the ion-generating chamber. Therefore, only the ion output section can be replaced with a new one, if it is worn out.

19 Claims, 6 Drawing Sheets

ION GENERATOR

BACKGROUND OF THE INVENTION

1. Field of the Invention

The present invention relates to an ion generator for use in an ion implantation apparatus, an ion repair apparatus, an ion etching apparatus, or the like.

2. Description of the Related Art

In an ion generator of this type, a voltage is applied between a filament and an anode, a predetermined gas is introduced between the electrodes to produce a plasma, and certain ions are collected from the plasma. A Freeman-type ion generator is well-known as this type of ion generator and is widely used in the art.

In Published Unexamined Japanese Patent Application (PUJPA) No. 62-278736 filed by the same assignee as this case, an ion generator used for electron beam excitation is proposed. In this ion generator, a voltage is applied between a filament and an anode, to thereby produce a first plasma from a predetermined gas, and then electrons are collected from the first plasma. An ion-generating gas is introduced into an ion-generating chamber and is irradiated with the electrons collected from the first plasma, to thereby produce a second plasma. The ions contained in the second plasma are collected through an ion output slit of the ion-generating chamber.

The ion generator mentioned in the preceding paragraph is advantageous, in that a high ion-current density can be obtained with a small amount of ion energy.

In an ion generator, it is likely that the structural components exposed to a plasma will be worn away since the ions of the plasma have sputtering and etching effects on such structural components. It is also likely that the substance produced by sputtering will adhere to, or be deposited on the structural components. This being so, the ion generator has to be maintained regularly. For instance, it has to be regularly cleaned or its structural components have to be regularly replaced with new ones.

If the ion generator uses a material gas which has a high degree of etching characteristic, the structural components of the ion generator will be markedly worn away, and the substance produced by sputtering will be deposited over the structural components in large quantities. Let it be assumed that an ion-generating chamber is formed of molybdenum and that the material gas is $BF_3$. In this case, an insulating material, such as molybdenum fluoride, attaches to the surface of the ion-collecting electrode, thus adversely affecting the function of this electrode.

The ions generated in the ion-generating chamber pass through the ion output slit. Therefore, the structural component in which the ion output slit is formed wears away most noticeably than the other structural components of the ion generator. Since the structural component having the ion output slit is integral with the other portions of the ion-generating chamber, the ion-generating chamber has to be regularly replaced with a new one.

In the ion generator, the voltage applied between the ion-generating chamber and the ion-collecting electrode is as high as 32 KV or so. Due to the application of such a high voltage, a spark discharge may occur. If a spark discharge occurs, the structural components are damaged.

Conventionally, the ion generator has been cleaned in the manner below. First, the ion generator is switched off, so as to bring the highly-vacuum regions inside the ion generator into a normal-pressure state. Then, the contaminated portions of the ion generator are manually cleaned or polished. Since this operation is performed with respect to the portions which are difficult of access, it requires much time and labor. This results in a decrease in the rate of operation of the ion generator, and the productivity is lowered, accordingly.

SUMMARY OF THE INVENTION

An object of the present invention is to provide an ion generator which withstands long use and which can be easily maintained.

Another object of the present invention is to provide an ion generator capable of producing ions at high efficiency from a solid material, such as a metallic material.

In an ion generator embodying the present invention, a raw material introduced into an ion-generating chamber is irradiated with electrons, for the generation of ions. The ions, thus generated, are collected by the ion-collecting electrode and are guided through an ion output section located inside the ion-generating chamber. At least the inner wall of the ion-generating chamber is formed of a conductive ceramic material.

According to the first aspect of the present invention, the ion output section is detachable from the main body of the ion-generating chamber. More preferably, it is coupled to the main body of the ion-generating chamber by utilization of a dovetail joint structure.

The ion generator according to the first aspect is advantageous, in that only the ion output section can be replaced with a new one if it is worn out. In comparison with the case where the whole of the ion-generating chamber is replaced, the replacement is very easy to perform, so that the maintenance of the ion generator can be carried out easily.

According to the second aspect of the present invention, that corner of the ion-generating chamber which faces the ion-collecting electrode is curved. More preferably, that outer wall of the ion-generating chamber which faces the ion-collecting electrode has a specular surface.

The ion generator according to the second aspect is advantageous, in that an undesirable spark discharge does not easily occur in spite of the application of a high voltage. Therefore, the structural components of the ion generator are not damaged in comparison with the conventional ion generator.

According to the third aspect of the present invention, the ion generator comprises: means for removably holding a solid raw material in the ion-generating chamber; means for sputtering the solid raw material by bombarding it with first ions; and means for generating second ions by irradiating the sputtered material with electrons.

The ion generator according to the third aspect is advantageous, in that ions of a high-melting point metal or ions of other solid materials can be generated with high efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
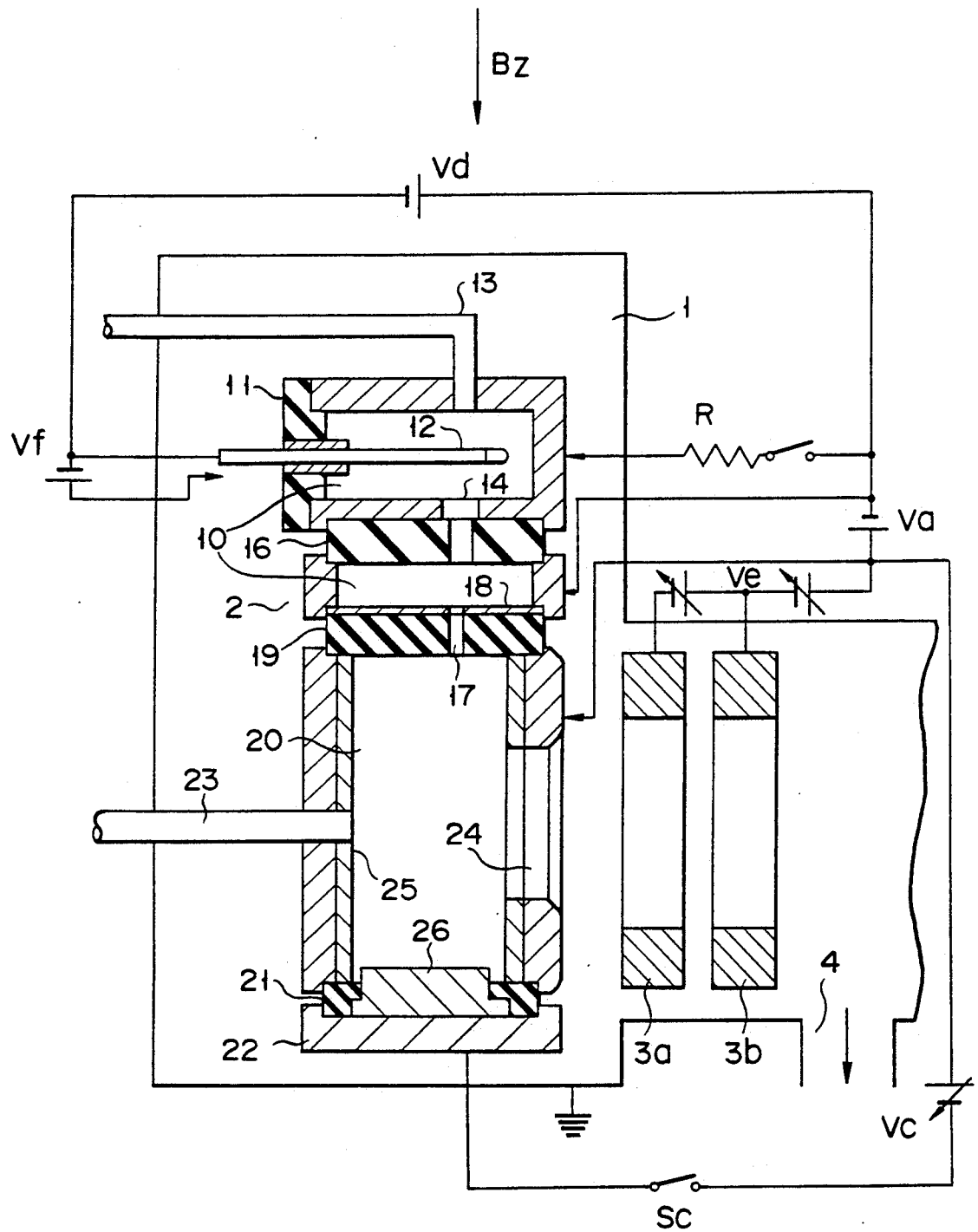
FIG. 1 is a longitudinal sectional view of an ion implantation apparatus which incorporates an ion generator according to the first embodiment of the present invention.
Figure 2:
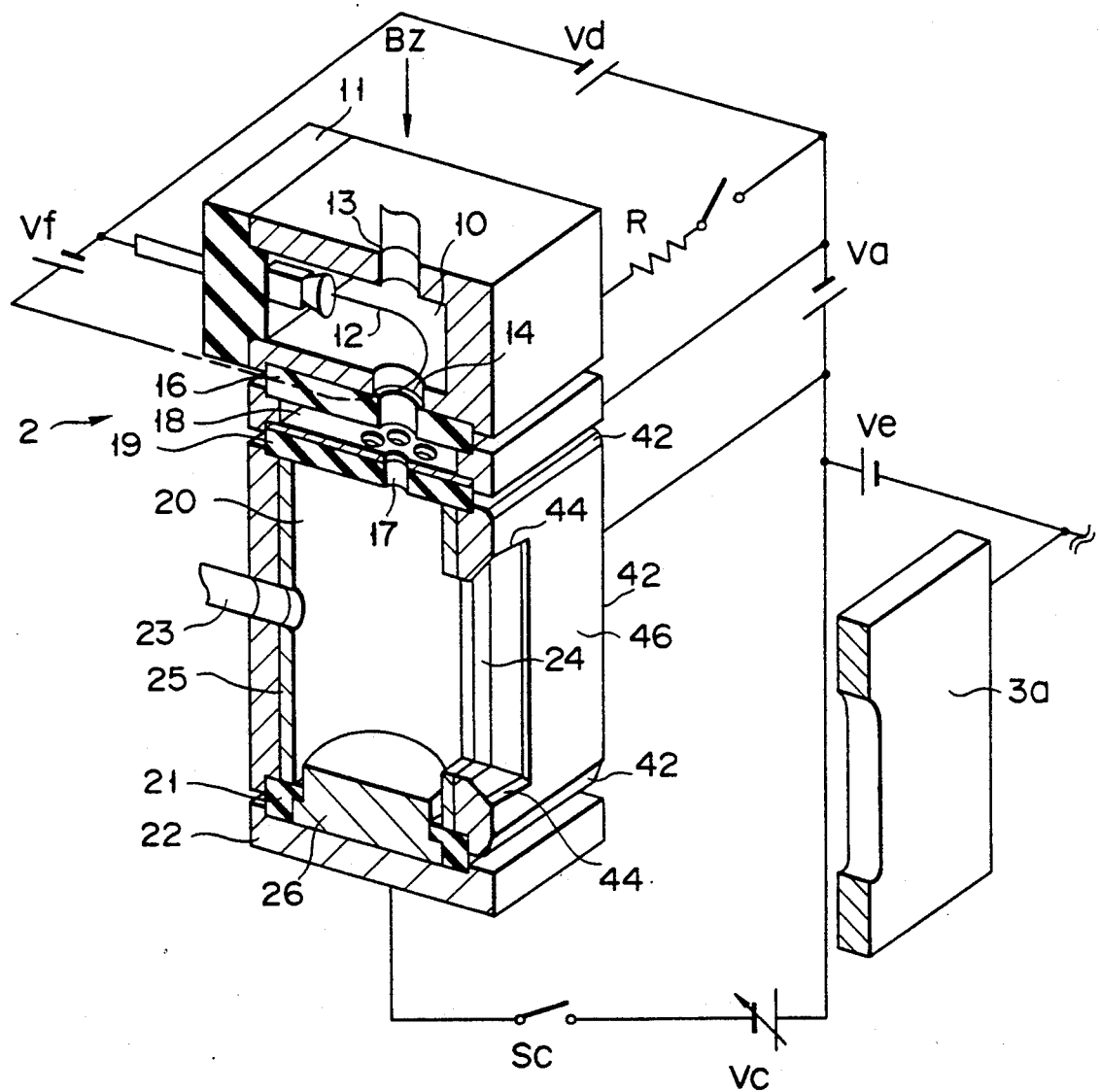
FIG. 2 is a partially-sectional perspective view of the ion generator shown in FIG. 1.

FIG. 1 is a longitudinal sectional view of an ion implantation apparatus which incorporates an ion generator according to the first embodiment of the present invention, and FIG. 2 is a partially-sectional perspective view of the ion generator shown in FIG. 1.

Referring to FIGS. 1 and 2, the ion generator 2 is located inside the vacuum container 1 of the ion implantation apparatus. Ion-collecting electrodes 3a and 3b are located on one side of the ion generator 2, so as to collect ions generated by the ion generator 2. Although not shown, the ions collected by the ion-collecting electrodes 3a and 3b are selected, accelerated, and deflected by a mass-spectrometry magnet, an accelerating tube, a deflecting electrode, etc., which are arranged on one side of the ion-collecting electrodes 3a and 3b. The ions are guided to an object to be processed, e.g., a semiconductor wafer, which is held by a platen located at one end of the vacuum envelope 1. Accordingly, the object is doped with the ions. The vacuum container 1 has a discharge port 4, through which a gas can be discharged from the vacuum container 1.

An electron-generating chamber 10, which is formed of either a conductive high-melting point material (e.g., molybdenum) or a conductive ceramic material, is located above the ion generator 2. The electron-generating chamber 10 is like a rectangular-parallelepipedic container, the height, length and width of which are several centimeters or so. A filament 12, which is formed by e.g. a U-shaped tungsten wire, is located inside the electron-generating chamber 10, and is supported by a plate-like heat-resistant insulating member formed of $Si_3N_4$, BN, or the like.

As the conductive ceramic material mentioned above, it is preferable to use "BN Composite EC" (trade name), which is commercially available from Electro-Chemical Industries, Co., Ltd., Japan. Alternatively, the use of a conductive ceramic material containing SiC, TiC, $TiB_2$, $ZrB_2$, and TiN as major constituents is preferable.

A discharge gas-introducing pipe 13 is connected to the upper portion of the electron-generating chamber 10. Through the discharge gas-introducing pipe 13, a discharge gas (e.g., Ar), with which to produce a plasma for the generation of electrons, is introduced into the electron-generating chamber 10. A circular opening 14 is formed in the bottom wall of the electron-generating chamber 10. Through the circular opening 14, electrons taken out of the plasma are discharged from the electron-generating chamber 10.

An insulating member 16 is located under the electron-generating chamber 10. This insulating member 16 defines a narrow path 15 communicating with the circular opening 14. An electron-collecting electrode 18 having a plurality of through-holes 17 is located below the insulating member 16.

An ion-generating chamber 20 is located under the electron-generating chamber 10, with an insulating member 19 interposed. The ion-generating chamber 20 is made by a container-like member formed of a high-melting point material (e.g., molybdenum), and the interior of the ion-generating chamber 20 defines a cylindrical region, the height and diameter of which are several centimeters or so. A bottom plate is attached to the lower side of the ion-generating chamber 20, with an insulating member 21 interposed. A raw gas-introducing pipe 23 is connected to the side wall of the ion-generating chamber 20, and a raw gas (e.g., $BF_3$, $AsH_3$, $PH_3$), with which to produce desirable ions, is introduced into the ion-generating chamber 20 through the raw gas-introducing pipe 23. An ion output slit 24 is formed in that portion of the side wall which faces the raw gas-introducing pipe 23.

The temperature in the ion-generating chamber 20 becomes high when a plasma is produced. However, since the ion-generating chamber 20 is formed of a high-melting point material, such as molybdenum, no special cooling mechanism is needed. Thus, the size of the ion generator 2 can be reduced, accordingly.

In the first embodiment, an inner cylinder 25 is arranged inside the ion-generating chamber 20. This inner cylinder 25 is formed of a material which is resistant to the action of a plasma, such as sputtering and etching. For example, it is formed of a conductive ceramic material. Since the inner cylinder 25 covers the metallic surface portions of the ion-generating chamber 20, the inner wall of the ion-generating chamber 20 is protected from the plasma produced inside the ion-generating chamber 20. Likewise, a plate 26 which is formed of a material resistant to the action of a plasma (the plate 26 is formed of a conductive ceramic material, for example) covers the bottom plate 22 of the ion-generating chamber 20. Therefore, the bottom plate 22 is also protected from the plasma.

Figure 3:
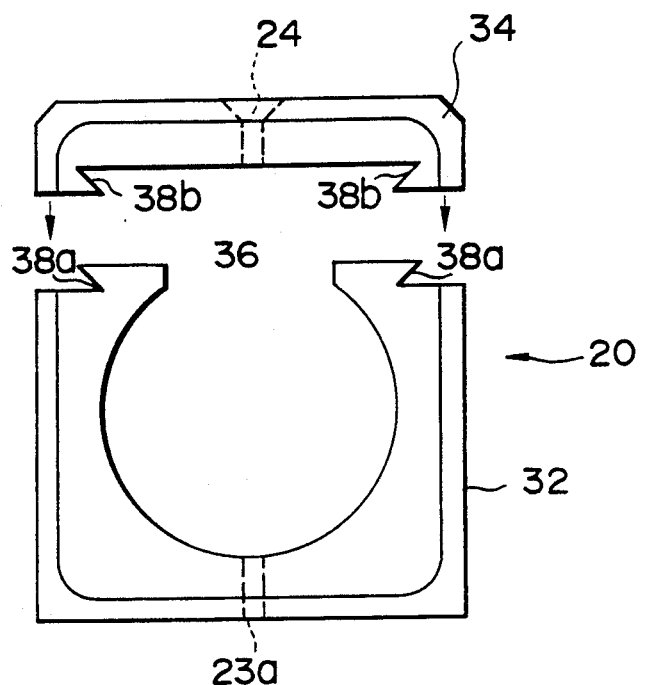
FIGS. 3 and 4 are a plan view and a front view, respectively, which show the relationships between the ion output section and main body of the ion-generating chamber.
Figure 4:
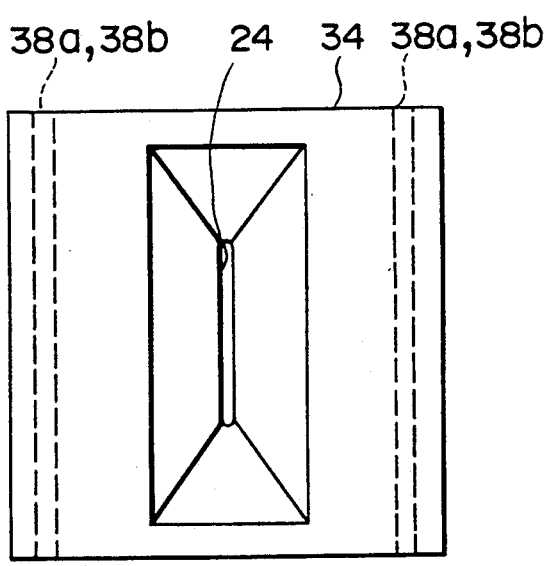

As is shown in FIGS. 3 and 4, the side wall of the ion-generating chamber 20 is made up of a main body 32 and an ion output section 34.

The main body 32 is made by a laminated plate having a molybdenum layer and a conductive ceramic layer. An opening 36 is formed in one side face of the main body 32, and a dovetail 38a is formed in such a manner as to sandwich the opening 36. A hole 23a is formed in the rear side wall facing the opening 36, so as to permit the raw gas-introducing pipe 23 (FIG. 1) to be connected to the ion-generating chamber 20.

Like the main body 32, the ion output section 34 is made by a plate having a molybdenum layer and/or a conductive ceramic layer. A slit 24 is formed substantially in the center of the ion output section 34, and a dovetail groove 38b is formed in such a manner as to sandwich the slit 24. The dovetail groove 38b of the ion output section 34 is engageable with the dovetail 38a of the main body 32.

With the dovetail 38a being engaged with the dovetail groove 38b, the ion output section 34 can be detachably coupled to the main body 32 in such a manner that the opening 36 of the main body 32 is covered with the ion output section 34. When the main body 32 and the ion output section 34 are coupled together, a substantially cylindrical region the height and diameter of which are several centimeters or so, is defined inside.

With the above structure, even if the ion output section is worn out (which section easily wears away in comparison with the other sections of the ion-generating chamber), it is not necessary to replace the whole of the ion-generating chamber. That is, only the ion-output section can be easily replaced with a new one since it is coupled to the main body by utilization of a dovetail joint. In comparison with the case where the whole of the ion-generating chamber is replaced, the replacement is very easy to perform, so that the maintenance of the ion generator can be carried out easily. In addition, the running cost of the ion generator can be reduced since the manufacturing cost of the ion output section is naturally lower than the whole of the ion-generating chamber.

It is possible to prepare a number of ion output sections which are formed of different materials, respectively. For instance, one of the ion output sections is formed of molybdenum, another is formed of a conductive ceramic material, and the like. If such ion output sections are prepared, a desirable one can be selectively used in accordance with the kind of ions to be collected. For instance, it is possible to employ an ion output section which is resistant to sputtering or etching and which is formed of a material different from that of the main body of the ion-generating chamber. In this manner, the flexible use of the ion generator is ensured.

In the first embodiment mentioned above, the main body 32 and the ion output section 34 are coupled together by utilization of a dovetail joint structure. However, if dust arises from the dovetail joint structure is considered a problem (such dust may be generated when the dovetail 38a is slid along the dovetail groove 38b), the dovetail joint structure may be replaced with a banana plug structure made up of male and female portions. Since the engagement portion of this banana plug structure is not exposed at the time of generation of ions, generation of dust is prevented.

Figure 5:
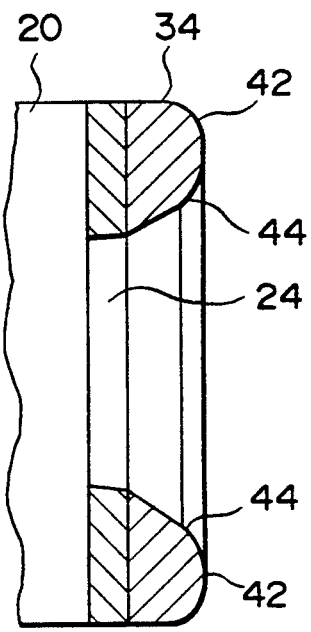
FIGS. 5 and 6 are a partially-sectional side view and a partially-sectional plan view, respectively, which show the front portion of the ion-generating chamber of the ion generator.
Figure 6:
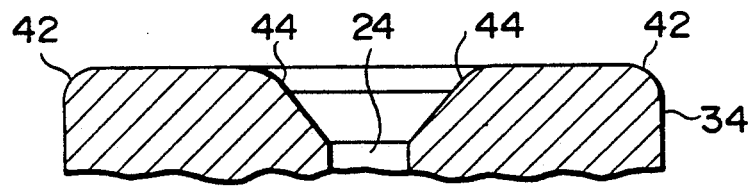

As is shown in FIGS. 5 and 6, the corners 42 of the outer wall of the ion output section 34 are curved as if they were chamfered. Likewise, those portions 44 of the outer wall which ar located around the ion output slit 24 are also curved as if they were chamfered. These structures are intended to suppress the occurrence of a spark discharge in spite of the application of a high voltage. If corners 42 and portions 44 are not curved, a spark discharge may easily take place as a result of the application of a high voltage.

Of the outer side walls of the ion-generating chamber 20, that one 46 which faces the ion-collecting electrodes 3a and 3b is specularly polished. This structure is also intended to suppress the occurrence of a spark discharge. If the outer side wall 46 is not specularly polished but is uneven, its projected portions will induce an undesirable spark discharge with reference to the ion-collecting electrodes 3a and 3b.

Because of the curved corners 42 and curved portions 44 and because of the specularly-polished outer side wall 46, a spark discharge does not easily take place, in spite of the application of a high voltage $V_e$. Therefore, damage caused by such a spark discharge is prevented.

A description will now be given as to how ions are generated by use of the ion generator mentioned above.

When the ion generator is in use, it is kept applied with a magnetic field by a magnetic field-generating device (not shown). The magnetic field acts such that electrons are guided in the direction of arrow $B_Z$ in FIG. 1. Under this condition, the ion generator is actuated as follows.

A filament voltage $V_f$ is applied to the filament 12 located inside the electron-generating chamber 10, so that the filament 12 generates heat due to the current induced by the filament voltage. A discharge voltage $V_d$ is applied, through a resistor R, to the outer wall of the electron-generating chamber 10, a discharge voltage $V_d$ is applied to the electron-collecting electrode 18, and an accelerating voltage $V_a$ is applied between the electron-collecting electrode 18 and the ion-generating chamber 20.

With the voltages applied as above, a discharge gas (e.g., Ar) is introduced into the electron-generating chamber 10 through the discharge gas-introducing pipe 13 at the predetermined flow rate, e.g., 0.05 SCCM or higher. Since the discharge voltage $V_d$ is applied to the electron-generating chamber 10, a plasma is produced inside the electron-generating chamber 10. Due to the application of the accelerating voltage $V_a$, electrons contained in the plasma are guided into the ion-generating chamber 20 by way of the through-holes 17 of the electron-collecting electrode 18.

In the meantime, a predetermined amount of raw gas is introduced into the ion-generating chamber 20 through the raw gas-introducing pipe 23 at the predetermined flow rate, e.g., 0.15 SCCM or higher. Simultaneously, the gas is discharged from the ion-generating chamber 20 through the discharge port 4, such that the pressure of the raw gas in the ion-generating chamber 20 is within a predetermined range, e.g., 0.001 to 0.02 Torr.

The electrons drifting into the ion-generating chamber 20 are accelerated due to the accelerating voltage, and then collide with molecules of the raw gas, thus producing a dense plasma. Ions contained in the plasma are collected by the ion-collecting electrodes 3a and 3b and are guided out of the ion-generating chamber 20 through the ion output slit 24. The ions, thus collected, are irradiated onto a semiconductor wafer or the like as an ion beam.

It should be noted that the ion-generating chamber 20 is not entirely covered with the inner cylinder 25. For example, that portion of the ion-generating chamber 20 which defines the ion output slit 24 is exposed to the plasma generated in the ion-generating chamber 20. Such a portion is worn away due to the action of the plasma (e.g., sputtering, etching, or the like). The molecules of the worn-away portions drift toward the ion-collecting electrodes 3a and 3b and adhere to them and their neighboring portions. In addition, phosphorus, arsenic, and some other substances produced from the raw gas also adhere to the ion-collecting electrodes 3a and 3b and their neighboring portions.

Therefore, cleaning has to be carried out to remove the extraneous matter away from the ion-collecting electrodes 3a and 3b and from the neighboring portions. This cleaning operation is performed as follows.

An cleaning gas (i.e., an activated gas), such as a boron fluoride gas ($BF_3$), a chlorine gas, or a nitrogen trifluoride gas ($NF_3$), is introduced into the ion-generating chamber 20 of the ion generator 2. The cleaning gas, thus introduced, is irradiated with electrons in the same manner as in the above-mentioned ion doping process, to thereby produce a plasma. A cleaning gas is further introduced into the ion-generating chamber 20 such that the pressure in the vacuum container 1 is maintained in the range of 0.001 to 0.01 Torr. In this condition, the ion-collecting electrodes 3a and 3b are applied with such a voltage as will cause a glow discharge in the vacuum container 1. As a result, the plasma flows out of the ion-generating chamber 20 through the ion output slit 24, due to the gas stream caused by the gas discharge from the discharge port 4. Therefore, the plasma touches the extraneous matter adhering to the ion-collecting electrodes 3a and 3b and the neighboring portions. The extraneous matter is removed by the etching action of the plasma.

As mentioned above, the ion generator can be cleaned by utilization of a plasma, without wasting the filament or other portions. To carry out this cleaning operation, the pressure in the vacuum container 1 need not be returned to the normal pressure by switching off the ion implantation apparatus. Moreover, a troublesome manual cleaning operation is not required with respect to the structural components which are difficult of access. Therefore, contaminated portions of the ion generator can be easily cleaned in a short time.

Figure 7:
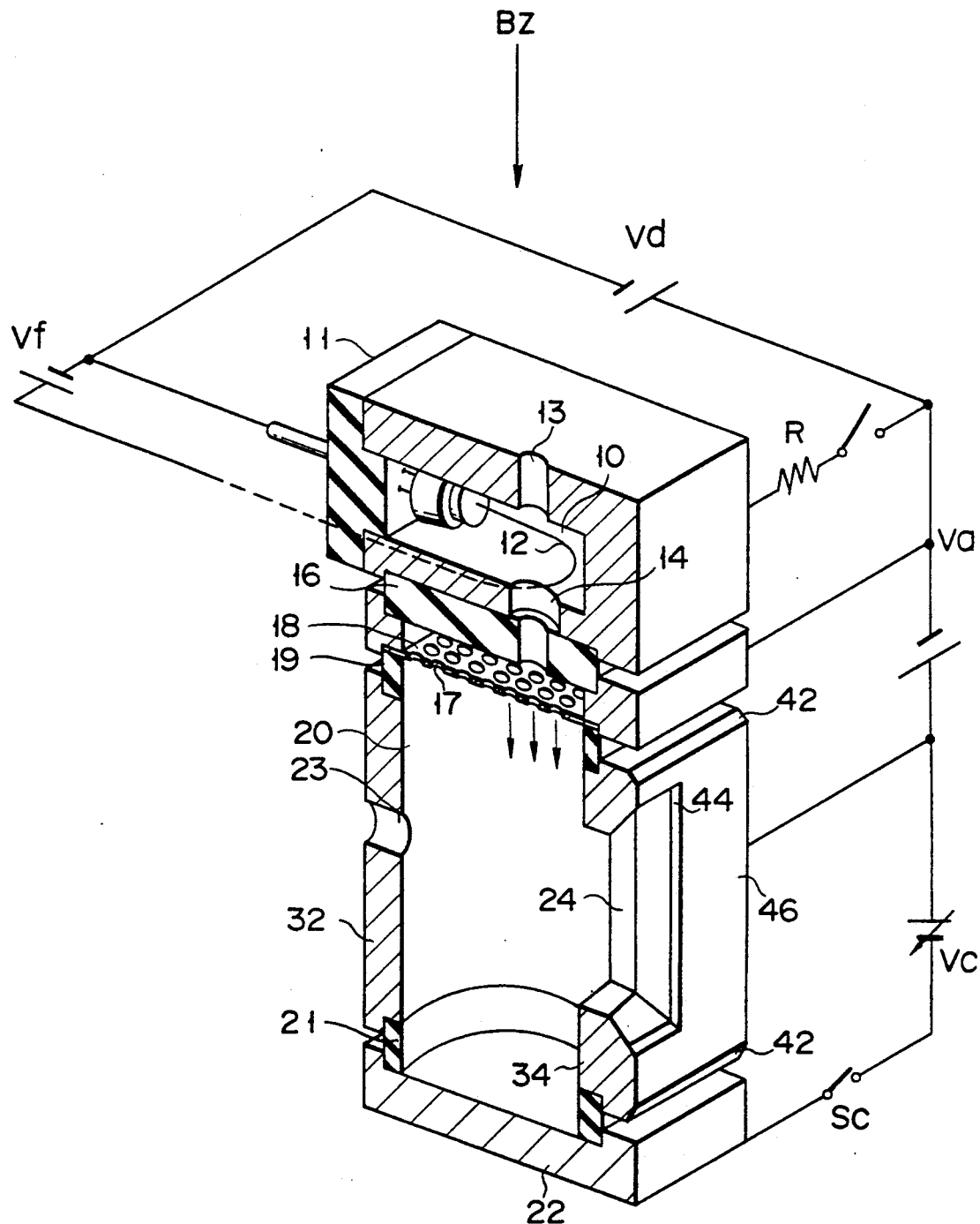
FIG. 7 is a partially-sectional perspective view of an ion generator according to the second embodiment of the present invention.

FIG. 7 shows an ion generator according to the second embodiment of the present invention. In FIG. 7, like reference numerals designate like structural components.

In the ion generator of the second embodiment, the ion-generating chamber 20 is not made by a laminated plate. It is made by a single-layer plate which is formed of a high-melting point conductive material, such as molybdenum. More preferably, the single-layer plate of constituting the ion-generating chamber 20 is formed of a conductive ceramic material. As this conductive ceramic material, the use of "BN Composite EC" (trade name) commercially available from Electro-Chemical Industries, Co., Ltd, Japan is preferable. Alternatively, the use of a conductive ceramic material containing SiC, TiC, $TiB_2$, $ZrB_2$, and TiN as major constituents is preferable. If the entirety of the ion-generating chamber 20 is formed of such a conductive ceramic material, even the portions that are not covered with the inner cylinder 25, such as the portions located around the ion output slit 24, are prevented from being damaged.

As in the first embodiment, the side wall of the ion-generating chamber 20 of the second embodiment is made up of a main body 32 and an ion output section 34, and these are detachably coupled together by utilization of a dovetail joint. Needless to say, they may be coupled together by utilization of another type of joint.

As in the first embodiment, only the ion-output section can be easily replaced with a new one, so that the maintenance of the ion generator can be carried out easily. In addition, the running cost of the ion generator can be reduced since the manufacturing cost of the ion output section is low.

As in the first embodiment, the corners 42 of the outer wall of the ion output section 34 and those portions 44 of the outer wall which are located around the ion output slit 24 are curved as if they were chamfered. Moreover, the side wall 46 which faces the ion-collecting electrodes 3a is specularly polished. With this structure, a spark discharge does not easily take place, in spite of the application of a high voltage $V_e$. Therefore, damage caused by such a spark discharge is prevented.

Figure 8:
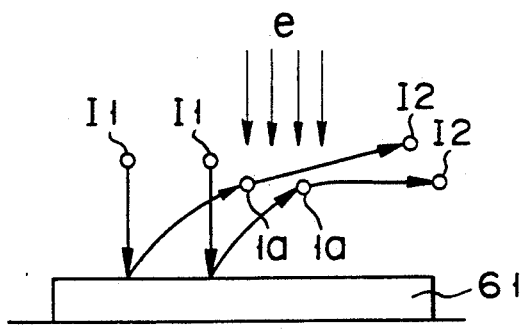
FIG. 8 is a sketch showing the principles underlying a method used for generating ions from a solid raw material.
Figure 9:
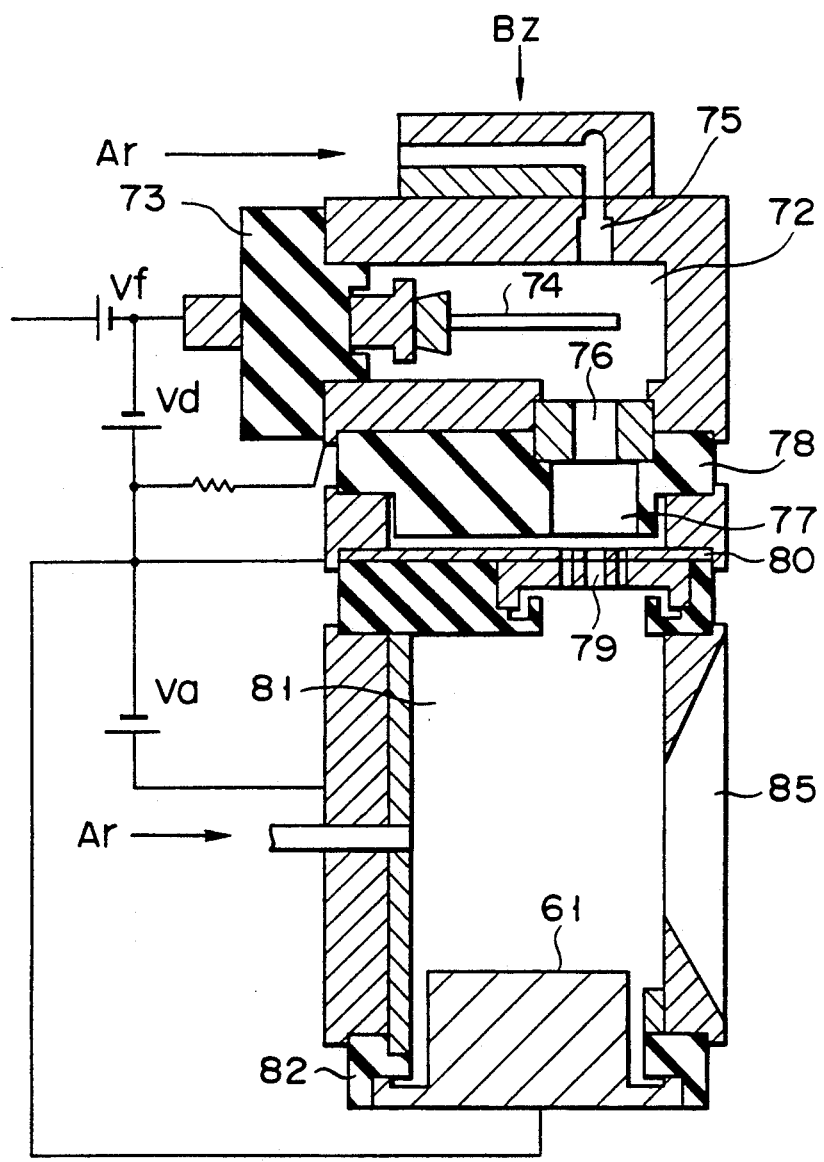
FIG. 9 is a partially-sectional perspective view of an ion generator according to the third embodiment of the present invention.

FIGS. 8 and 9 show an ion generator according to the third embodiment of the present invention. The ion generator of the third embodiment differs from the ion generators of the foregoing embodiments, in that it generates ions from a raw solid material, not from a gaseous raw material. More specifically, the ion generator of the third embodiment is suitable for generating ions of a high-melting point metal or ions of other solid materials.

An ion-generating method suitable for use in the ion generator of the third embodiment will be briefly explained. It should be noted that this method is applicable to the ion generators of the first and second embodiments as well.) In the method, a solid raw material 61, such as a lump of tungsten, molybdenum, titanium, aluminium, or the like, is placed in an ion-generating chamber, as is shown in FIG. 8. The solid raw material 61 is sputtered by bombarding it with first ions $I_1$ (e.g., argon ions) or sublimed by irradiating it with a high speed electron beam drawn from the first plasma. Solid particles la which are emitted from the solid raw material 61 as a result of the above treatment are bombarded with electrons e, to thereby produce second ions $I_2$, i.e., desirable ions. The use of this method enables highly-efficient generation of ions of a high-melting point metal or ions of other solid materials.

As is shown in FIG. 9, the ion generator 71 of the third embodiment comprises an electron-generating chamber 72. This electron-generating chamber 72 is formed like a rectangular-parallelepipedic container, the height, length and width of which are several centimeters or so. A U-shaped filament 74 is projected into the interior of the electron-generating chamber 72, and is supported by a plate-like heat-resistant insulating member formed of $Si_3N_4$, BN or the like.

The electron-generating chamber 72 is provided with a discharge gas-introducing hole 75. Through this hole 75, a discharge gas (e.g., Ar), with which to produce a plasma for the generation of electrons, is introduced into the electron-generating chamber 72. A circular opening 76 is formed in the bottom wall of the electron-generating chamber 72. Through this circular opening 76, electrons collected from the plasma are discharged from the electron-generating chamber 72.

An insulating member 78 is located under the electron-generating chamber 72. This insulating member 78 defines a path 77 communicating with the circular opening 76. An electrode 80 having a plurality of through-holes 79 is located below the insulating member 78, such that the through-holes 79 correspond in position to the path 77 of the insulating member 78. The electrode 80 may have a single through-hole, but it is more desirable for the electrode 80 to have a plurality of through-holes since the plasma confinement effect and electron collection effect are improved thereby.

An ion-generating chamber 81 is located under the electrode 80. The ion-generating chamber 81 is made by a container-like member, and the interior of the ion-generating chamber 81 defines a cylindrical region, the height and diameter of which are several centimeters or so. A solid raw material 61 is located in the bottom of the ion-generating chamber 81 as a bottom plate. The solid raw material 61 has a discoidal shape and is either a ceramic material or a metal exemplified by tungsten, molybdenum, titanium, or aluminium. The solid raw material 61 is supported by a bottom ring 82 formed of an insulating material. Since the raw material 61 as the bottom plate is removably coupled to the ion-generating chamber 81 by means of e.g. screws, the solid raw material 61 can be easily replaced with another by removing it from the ion-generating chamber 81. The raw material 61 may be placed on a conductive plate exclusively used as a bottom plate.

A gas-introducing port 84 is formed in one side wall of the ion-generating chamber 81. Through this port 84, a gas used for sputtering (e.g., Ar) is introduced into the ion-generating chamber 81. An ion output slit 85 is formed in that portion of the side wall which faces the gas-introducing port 84.

A description will now be given as to how ions are generated by use of the ion generator of the third embodiment. If the ions to be generated by use of this ion generator are molybdenum ions, then a discoidal lump of molybdenum is placed beforehand in the ion-generating chamber 81, and the ion generator is kept applied with a magnetic field by a magnetic field-generating device (not shown). The magnetic field acts such that electrons are guided in the direction of arrow $B_Z$ in FIG. 9. Under this condition, the ion generator is actuated as follows.

A filament voltage is applied to the filament 74 inside the electron-generating chamber 72, and a discharge voltage is applied to the electron-generating chamber 72. In addition, an electron-collecting voltage is applied between the electron-generating chamber 72 and the electrode 80 and further between the electrode 80 and the ion-generating chamber 81.

With the voltages applied as above, a discharge gas (e.g., Ar) is introduced into the electron-generating chamber 72 through the discharge gas-introducing hole 75. The discharge gas is excited by the thermions emitted by the filament 74, thus producing a plasma. Electrons contained in the plasma are accelerated and guided into the ion-generating chamber 81 by way of the through-holes 79.

In the meantime, a predetermined gas used for sputtering (e.g., Ar) is introduced into the ion-generating chamber 81 through the gas-introducing port 84.

The electrons flowing into the ion-generating chamber 81 are accelerated by an accelerating electric field, and then collide with the argon gas, thus producing argon ions (first ions) $I_1$. Simultaneously, the electrons reach the solid raw material 61, which is supported by the bottom ring 82 formed of an insulating material and which is kept in an electrically floated condition. As a result, the solid raw material 61 is negatively-charged. If necessary, the solid raw material 61 may be applied with a negative potential by use of an external potential-providing device.

Since the solid raw material 61 is negatively-charged, the argon ions generated in the ion-generating chamber 81 are accelerated toward the solid raw material 61. When the argon ions collide with the solid raw material 61, they sputter the solid raw material 61. Since the particles 1a of the material 61 emitted by the sputtering are irradiated with electrons, desirable ions (second ions) $I_2$ are generated.

The ions (second ions) generated in the manner mentioned above are drawn by e.g. ion-collecting electrodes and are guided out of the ion-generating chamber 81 through the ion output slit 85. Thereafter, the ions are implanted into a semiconductor wafer or the like.

As can be understood from the above, the ion generator of the third embodiment ensures highly-efficient generation of ions of a high-melting point metal. The ion generator ensures highly-efficient generation of ions of other kinds as long as their source material can be formed as solid. According to the third embodiment, the ion generation source need not be solid; in other words, it is not absolutely necessary to arrange the solid raw material 61 mentioned above. In this case, a raw gas, such as $BF_3$, is introduced into the ion-generating chamber 81, in place of the sputtering gas, and desirable ions, such as boron ions, can be derived from the raw gas.

In the above, the first through third embodiments were described, referring to the case where the present invention was applied to an ion implantation apparatus. However, the present invention is in no way limited to this. The invention can be also applied to an etching apparatus, an ion repair apparatus, an ashing apparatus, etc. as long as ions are generated in these apparatuses.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An ion generator, wherein ions are generated from a raw material introduced into an ion-generating chamber, with the raw material being irradiated with electrons, and wherein an ion-collecting electrode guides the generated ions out of the ion-generating chamber by way of an ion output section provided for the ion-generating chamber, the improvement being that said ion output section is detachable from a main body of the ion-generating chamber, wherein said main body and said ion output section of the ion-generating chamber are detachably coupled together by utilization of a dovetail joint.

2. An ion generator according to claim 1, wherein that corner of the ion-generating chamber which faces the ion-collecting electrode is curved.

3. An ion generator according to claim 1, wherein that outer wall of the ion-generating chamber which faces the ion-collecting electrode is specular.

4. An ion generator according to claim 1, wherein said ion-generating chamber includes an inner wall formed of a conductive ceramic material.

5. An ion generator according to claim 4, wherein said ion-generating chamber has a laminated-structure wall which is made up of an outer wall formed of molybdenum and an inner wall formed of a conductive ceramic material.

6. An ion generator according to claim 4, wherein said ion-generating chamber has a wall structure formed entirely of a conductive ceramic material.

7. An ion generator according to claim 1, wherein said raw material is a dopant gas selected from the group consisting of $BF_3$, $AsH_3$ and $PH_3$.

8. An ion generator, wherein ions are generated from a raw material introduced into an ion-generating chamber, with the raw material being irradiated with electrons, and wherein an ion-collecting electrode guides the generated ions out of the ion-generating chamber by way of an ion output section provided for the ion-generating chamber, the improvement being that that corner of the ion-generating chamber which faces the ion-collecting electrode is curved.

9. An ion generator according to claim 8, wherein that outer wall of the ion-generating chamber which faces the ion-collecting electrode is specular.

10. An ion generator according to claim 8, wherein said ion output section is detachable from a main body of the ion-generating chamber.

11. An ion generator according to claim 10, wherein said main body and said ion output section of the ion-generating chamber are detachably coupled together by utilization of a dovetail joint.

12. An ion generator according to claim 8, wherein said ion-generating chamber includes an inner wall formed of a conductive ceramic material.

13. An ion generator according to claim 12, wherein said ion-generating chamber has a laminated-structure wall which is made up of an outer wall formed of molybdenum and an inner wall formed of a conductive ceramic material.

14. An ion generator according to claim 12, wherein said ion-generating chamber has a wall structure formed entirely of a conductive ceramic material.

15. An ion generator according to claim 8, wherein said raw material is a dopant gas selected from the group consisting of $BF_3$, $AsH_3$ and $PH_3$.

16. An ion generator, wherein ions are generated from a raw material introduced into an ion-generating chamber with the raw material being irradiated with electrons, and wherein an ion-collecting electrode guides the generated ions out of the ion-generating chamber by way of an ion output section provided for the ion-generating chamber, said ion generator comprising:

means for removably holding a solid raw material as said raw material in the ion-generating chamber and near wall portions thereof;

means for sputtering the solid raw material by bombarding the solid raw material with first ions; and means for generating second ions by irradiating the sputtered material with electrons, wherein said solid raw material and said wall portions are electrically insulated from each other and said solid raw material is at a lower electrical potential than said wall portions.

17. An ion generator according to claim 16, wherein said ion-generating chamber includes an inner wall formed of a conductive ceramic material.

18. An ion generator according to claim 17, wherein said means for sputtering the solid raw material includes electron-generating means electrically insulated from said ion-generating chamber, in which that portion of said electron-generating means which defines an electron-outlet to said ion-generating chamber has an electric potential lower than that of the wall portion of said ion-generating chamber.

19. An ion generator according to claim 17, wherein said ion-generating chamber is provided with a magnetic field such that electrons from said electron-generating means are guided toward said raw material by said magnetic field.

* * * * *